United States Patent
Leroux et al.

(10) Patent No.: US 11,965,268 B2
(45) Date of Patent: Apr. 23, 2024

(54) GROUP 13 ELEMENT NITRIDE WAFER WITH REDUCED VARIATION IN OFF-CUT ANGLE

(71) Applicant: IV WORKS CO., LTD, Daejeon (KR)

(72) Inventors: Vianney Leroux, Antibes (FR); Vincent Gelly, Valbonne (FR); Nabil Nahas, Mougins (FR); Kevin Provost, Le Luc en Provence (FR)

(73) Assignee: IV WORKS CO., LTD. (KR)

( * ) Notice: Subject to any disclaimer, the term of this patent is extended or adjusted under 35 U.S.C. 154(b) by 0 days.

(21) Appl. No.: 17/774,690

(22) PCT Filed: Nov. 5, 2020

(86) PCT No.: PCT/FR2020/052004
§ 371 (c)(1),
(2) Date: May 5, 2022

(87) PCT Pub. No.: WO2021/089947
PCT Pub. Date: May 14, 2021

(65) Prior Publication Data
US 2022/0282397 A1    Sep. 8, 2022

(30) Foreign Application Priority Data
Nov. 5, 2019   (FR) ...................................... 1912414

(51) Int. Cl.
*C30B 25/02* (2006.01)
*C30B 29/40* (2006.01)
*C30B 33/08* (2006.01)

(52) U.S. Cl.
CPC ............ *C30B 29/406* (2013.01); *C30B 25/02* (2013.01); *C30B 33/08* (2013.01)

(58) Field of Classification Search
CPC ........ C30B 25/02; C30B 29/406; C30B 33/08
See application file for complete search history.

(56) References Cited

U.S. PATENT DOCUMENTS

| | | | |
|---|---|---|---|
| 9,650,723 B1 * | 5/2017 | D'Evelyn | ................. C30B 9/00 |
| 2002/0152952 A1 | 10/2002 | Beaumont et al. | |
| 2005/0104162 A1 | 5/2005 | Xu et al. | |
| 2006/0035440 A1 | 2/2006 | Ghyselen et al. | |

(Continued)

FOREIGN PATENT DOCUMENTS

| | | |
|---|---|---|
| EP | 1338683 A2 | 8/2003 |
| EP | 1528591 A2 | 5/2005 |

(Continued)

OTHER PUBLICATIONS

Foronda, H. M. et al., "Curvature and bow of bulk GaN substrates," Journal of Applied Physics, Jul. 2016, pp. 035104-1-035104-7, vol. 120. XP012210446.

French Preliminary Search Report for Application No. FR 1912414 dated Sep. 29, 2020, 2 pages. [See p. 1, categorizing the cited references].

(Continued)

*Primary Examiner* — Elizabeth E Mulvaney
(74) *Attorney, Agent, or Firm* — Lerner David LLP

(57) ABSTRACT

The invention relates to a two-dimensional crystal wafer of group 13 or III element nitride which is delimited by a face of orientation N, an opposing face of orientation E depending on the group 13 or III element, E being selected preferably from Ga, In, Al or a combination of these elements, characterized in that the variation in crystalline off-cut angle in the largest dimension of said wafer is less than $5 \times 10^{-3}$°/mm, and its curvature of geometric deformation of its faces exhibits a flexure in terms of absolute value of less than $10^{-3}$ mm/mm of the largest dimension of said wafer.

18 Claims, 5 Drawing Sheets

(56) References Cited

U.S. PATENT DOCUMENTS

| | | |
|---|---|---|
| 2007/0072396 A1 | 3/2007 | Feltin et al. |
| 2012/0184090 A1 | 7/2012 | Ueno |
| 2019/0157509 A1 | 5/2019 | Tashiro et al. |
| 2022/0112624 A1* | 4/2022 | Mikawa ................ C30B 7/105 |

FOREIGN PATENT DOCUMENTS

| | | |
|---|---|---|
| EP | 1699951 A2 | 9/2006 |
| JP | S5659699 A | 5/1981 |
| JP | 2017052691 A | 3/2017 |
| WO | 9920816 A1 | 4/1999 |

OTHER PUBLICATIONS

International Search Report for Application No. PCT/FR2020/052004 dated Feb. 25, 2021, pp. 1-3.

Yoshida, T. et al., "Recent Progress of Gan Substrates Manufactured By Vas Method," Advances in Solid Oxide Fuel Cells and Electronic Ceramics : A Collection of Papers Presented at 39th International Conference on Advanced Ceramics and Composites, Oct. 2015, pp. 129-138, John Wiley & Sons. Inc. XP055734555.

Yuasa, T. et al., "Effect of Slight Misorientation of Sapphire Substrate on Metalorganic Chemical Vapor Deposition Growth of GaN," Japanese Journal of Applied Physics, Jul. 1999, pp. L703-L705, vol. 38.

Sardela, M. "X-ray analysis methods" AMC 2017—Advanced Materials Characterization Workshop Jun. 6 & 7, Jun. 2017, pp. 1-90, University of Illinois Board of Trustees.

\* cited by examiner

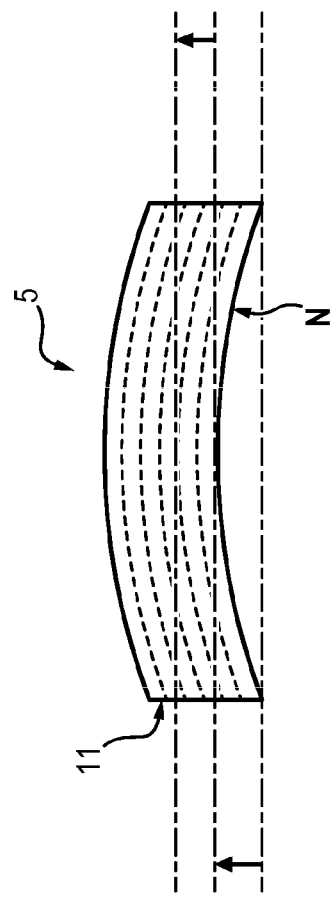
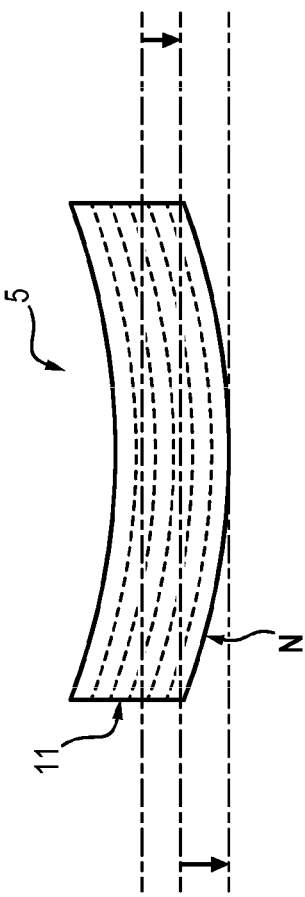

GROUP 13 ELEMENT NITRIDE WAFER WITH REDUCED VARIATION IN OFF-CUT ANGLE

CROSS-REFERENCE TO RELATED APPLICATIONS

The present application is a national phase entry under 35 U.S.C § 371 of International Application No. PCT/FR2020/052004 filed Nov. 5, 2020, which claims priority from French Application No. 1912414 filed Nov. 5, 2019, all of which are hereby incorporated herein by reference.

TECHNICAL FIELD

The invention relates to the general field of semiconductor materials based on element nitride of group 13 or III of the periodic table—especially such as a gallium nitride GaN.

In particular, the present invention concerns wafers of group 13 element nitride as well as the manufacturing method and the use thereof.

Such a group 13 element nitride wafer can be intended for creating semiconductor structures such as light-emitting diodes (LEDs) or laser diodes (LDs) or other electronic components.

PRESENTATION OF THE PRIOR ART

The current methods for manufacturing semiconductor materials based on group 13 element nitride rely on the so-called heteroepitaxy technique which consists of growing a crystal (such as a crystal of gallium nitride GaN) on a starting substrate of a different nature (such as a sapphire substrate).

However, the heteroepitaxy technique can induce numerous crystalline defects in the structure of the group 13 element nitride, such as dislocations, limiting the performances and service life of compounds based on group 13 element nitride as well as geometric deformation of the crystal and a high variation in the off-cut angle.

These defects are due to material differences between the starting substrate and the group 13 element nitride layer, and especially to the mismatch:
of the parameters of the crystal lattice (i.e. mesh parameters) between the starting substrate and group 13 element nitride layer, and
the thermal expansion coefficient between the starting substrate, generally sapphire, and the group 13 element nitride layer.

Different pathways for obtaining a crystal having crystalline and geometric deformations by heteroepitaxy are known.

One solution consists of allowing the free growth of the crystalline layer on the substrate so as to form a ball in which wafers of group 13 element nitride material can be cut. This route leads to a crystal with little crystalline quality gradient but the yield of this process calculated on the basis of the number of balls of good crystalline quality divided by the total number of balls formed is low. Furthermore, the dimensional quality and the variation of the off-cut angle still have room for improvement.

The crystalline quality can be measured by the width at mid-height of the x-ray diffraction peak (XRD) of the line (002) around the angle $\omega$ in symmetric condition of the GaN planes (0001).

Another pathway consists of depositing and forming a constrained layer beforehand of one piece with the plane substrate followed by a separation of said substrate in order to produce a self-supported crystalline layer. Unlike the previous method, this technique leads to a crystal having a crystalline quality gradient typically of at least 5% between the two opposite faces of the self-supported layer. This last method for self-supported crystal growth can lead to a very good yield of the method but the dimensional quality and variation of the off-cut angle can still be improved.

Document JPS5659699 thus describes the possibility of fabricating a group 13 element nitride crystal whose off-cut angle is comprised between 0.5 and 4 degrees, said crystal being obtained by epitaxy on a sapphire substrate having a off-cut angle comprised between 0.5 and 4 degrees. However, the crystalline quality of such a crystal is no longer sufficient to allow the manufacture of optoelectronic and electronic components, especially due to the presence of stacking faults and dislocations.

The article "Effect of Slight Misorientation of Sapphire Substrate on Metalorganic Chemical Vapor Deposition Growth of GaN by Takayuki YUASA and all in the Journal of Applied Physics vol 38 (1999) page L703-705 Part 2 no. 7A, 1 Jul. 1999 shows the benefit of using a sapphire substrate with a off-cut angle of around 0.1 to 0.2 degrees to create a GaN crystal of uniform morphology, the use of a starting substrate having too high a off-cut angle causing a GaN crystal to be obtained having a scale-shaped growth face. This pathway requires a very strict selection of substrate and is not necessarily sufficient since, as explained previously, the substrate off-cut angle is not the only determinant parameter.

Document US 2012/0184090 proposes a method wherein group 13 element nitride wafers with a non-zero off-cut angle are obtained by cutting a thick group 13 element nitride ingot with zero off-cut angle More precisely, the method described in US 2012/0184090 consists of:
growing a group 13 element nitride with a zero off-cut angle and
cutting the ingot along inclined cutting planes parallel to the crystallization plane on the periphery of said ingot.

This makes it possible to obtain group 13 element nitride wafers having a non-zero off-cut angle in the central region of the wafer, the off-cut angle reducing in a peripheral region of the wafer to the one diametrically opposite. However, cutting a thick ingot along an inclined cutting plane causes substantial material loss.

Document EP1528591 A2 proposes reducing the geometric deformation of a self-supported semiconductor crystal having a deflection of +/−100 μm at the end of growth in order to reach a range of at most +30 μm/−20 μm after the finishing step. The method consists of mechanical grinding of the concave face in order to obtain a damaged layer and flatten the crystal, said damaged layer being then able to be eliminated by chemical etching to reach the previous geometric specification. The damaged layer is very thin (a few micrometres) However, this document is silent relative to the variation of the off-cut angle. For the final application, this layer must be eliminated. However, during the elimination of the damaged layer, especially, for example, by chemical etching, the crystal deforms again and the variation of the off-cut angle remains high.

There is therefore still an unmet need for a crystal wafer of group 13 element nitride having a high crystalline quality and, in particular, in the case of self-supported crystals, said wafer having a crystalline quality gradient greater than 5%, for which the off-cut angle and the geometric deformation are permanently very low.

SUMMARY OF THE INVENTION

One goal of the present invention is to propose a crystal wafer exhibiting these characteristics obtained by means of a novel production method that can be implemented with any type of starting substrate, making it possible to obtain a final crystal having a low geometric deformation and variation of the off-cut angle despite the multiple deformations generated by the different finishing steps between obtaining the raw crystal and the final wafer ready to create an optoelectronic or electronic component.

The inventors have discovered that a particular method made it possible to obtain a crystal of group 13 or III element nitride, of two-dimensional structure, preferably self-supported, in particular a wafer delimited by a face of orientation N, an opposite face of orientation E according to group 13 or III element, E being chosen preferably from Ga, In, Al or a combination of these elements:

- of high crystalline quality, in particular and preferably such that
  the width at mid-height of the x-ray diffraction peak of the line (002) measured on the angle ω measured on the E face (0001) or FWHM'E, is less than 130 ArcSec
  and the quality gradient defined by the ratio (FWHM'N-FWHM'E)/thickness of said wafer, where FWHM'N designates the width at mid-height of the X-ray diffraction peak of the line (201) around the angle ω measured on the N face (Nitrogen) and FWHM'E is that measured on the face of element 13, is comprised in absolute value between 0.005 and 5 ArcSec/micrometre.
- for which the variation of the crystalline off-cut angle along the largest dimension of said wafer is less than $5 \times 10^{-3}$°/mm, i.e., less than 0.005° per mm, preferably less than $4 \times 10^{-3}$7 mm, preferably less than $2 \times 10^{-3}$°/mm, or even less than $1 \times 10^{-3}$°/mm, and
- whose geometric curvature or deformation of its faces has a deflection less in absolute value than $10^{-3}$°/mm/mm of the largest dimension of said wafer, preferably less than $6 \times 10^{-4}$ mm/mm,
- one surface of the wafer having a crystalline quality and roughness making it possible to grow a subsequent layer along a single direction,
- the largest length or diameter is greater than 50 mm, and
- a ratio R of the largest length to the thickness of the wafer is comprised between 80 and 500, preferably between 100 and 500, preferably 100 and 450, even between 100 and 350.

According to one possible embodiment, the E face is convex, such as shown in FIG. 1a and the geometric deflection of said E face is negative and greater than $-10^{-3}$ mm/mm of the largest dimension of said wafer, preferably greater than $-0.7 \times 10^{-3}$ mm/mm of the largest dimension of said wafer.

The method according to the invention comprises, in particular, the following steps:

a: obtaining a raw crystal wafer, preferably self-supported, of group 13 element nitride by epitaxial growth, b: determining the variation of the off-cut angle of said raw crystal at the end of growth, optionally after cutting said crystal, preferably by grinding or by cutting with a wire saw, to a relative thickness greater than $2 \times 10^{-3}$, preferably greater to $5 \times 10^{-3}$ and less than $10^{-2}$, said relative thickness corresponding to the ratio of the thickness of the wafer to its largest dimension, in particular to the largest width of its faces, c: strain hardening of one face in order to reduce the variation of the off-cut angle, in particular by sandblasting, exposure to laser radiation, shot peening, ion bombardment or another technique making it possible to create a surface mechanical stress on said crystal, so as to obtain a non-zero geometric deflection, in particular a geometric deflection comprised in absolute value between 0.001 and 1, preferably between 0.01 and 0.1 mm/mm of the largest dimension of said wafer d: after strain hardening, grinding the N face by machining, e: after strain hardening, grinding the E face by machining, f: polishing the E face, g: chemical etching the N face after machining the N face or after polishing the E face, h: cleaning to decontaminate the surfaces of the wafer i: preparation of the E face, in particular by plasma engraving, for subsequent deposition of at least one layer necessary for the production of an optoelectronic or electronic component.

In the sequence of steps of the method according to the invention, the inventors found that it is possible to obtain a very low variation of the off-cut angle by combining strain-hardening, not for purposes of geometrically straightening the crystal but in order, in the rest of the method, to make it possible to maintain an equality of the geometric deflection and crystalline deformation after grinding and etching of the N face in order to reduce the variation in off-cut angle of the crystal at the end of the finishing steps. Here, "equality of deflection" means the fact that the difference between the value of the geometric deflection and that of the crystalline deflection divided by the geometric deflection is less tan 5%, preferably less than 2% in algebraic value, i.e., in absolute value and in sign. The geometric deformation of the crystal due to this strain hardening step c is then corrected by subsequent grinding steps which will allow a reduction in the geometric deformation of the crystal.

In particular, the final crystal wafer obtained after finishing steps f), g), h) and i) has a crystalline deflection or curvature, corresponding to the deformation of its crystalline planes, less in absolute value than $1 \times 10^{-3}$ mm/mm of the largest dimension of said wafer, preferably less in absolute value than $0.5 \times 10^{-3}$ mm/mm of the largest dimension of said wafer. According to a preferred embodiment, this crystalline deflection remains less in absolute value than $1 \times 10^{-3}$ mm/mm at all the steps following strain hardening step c.

According to a particular embodiment, strain hardening is carried out until the variation of the off-cut angle is less than $5 \times 10^{-3}$° mm, preferably less than $4 \times 10^{-3}$° mm or even less than $3 \times 10^{-3}$° mm of the largest dimension of the wafer.

Preferably, strain hardening is carried out on the face of the wafer on which the crystal deformation is concave or for which the curvature of the crystal lattice is concave. Unlike the teaching of EP1528591 A2, strain hardening is not done until a geometric deflection equal to 0 is obtained but until the geometric deflection is aligned or equal to the crystalline deflection.

As is shown by Example 1 below, prior strain hardening step c) thus makes it possible to anticipate the deformations generated by the subsequent finishing operations, in particular the grinding operation and consecutive physicochemical operations of the wafer.

In the case where the N face of the wafer is concave, the strain hardening step c is done until a crystalline deflection is obtained comprised in absolute value between 0.2 and 2, preferably between 0.3 and 1.5, even between 0.4 and 1.0 µm/mm of the largest dimension of the wafer.

In the case where the N face of the wafer is convex, the strain hardening step c is done until a crystalline deflection is obtained comprised in absolute value between 0.1 and 1.5, preferably between 0.2 and 1.2, even between 0.2 and 1.0 µm/mm of the largest dimension of the wafer.

According to one possible embodiment, the thinning by machining in step b) is predetermined according to the initial geometric curvature of the raw crystal. This makes it possible to advantageously obtain a curvature corresponding to a deflection less than or equal to $6 \times 10^4$ mm/mm of the largest dimension of said crystal.

In particular, the inventors determined that it is possible by prior iteration on a series of wafers, for example in the case of a gallium nitride wafer, to define the optimum thickness of the wafer as a function of the geometric deflection of the raw crystal before strain hardening step c.

According to one possible embodiment, the optimum thickness $e_f$ of in µm of the crystal before strain hardening follows the following relation:

$$e_f = a \cdot f_i + b \cdot e_i$$

where f in µm is the initial deflection of the crystal in absolute value before grinding; $e_i$ is the initial thickness in µm of the crystal before cutting;

where a is comprised between −3.5 and −2 depending on the chemical composition of the crystal, and where b is comprised between 0.1 and 1.

The invention also concerns the use of a group 13 element nitride wafer such as described above for the fabrication of optoelectronic or electronic components, such as light-emitting diodes, laser diodes, transistors with vertical or horizontal, geometry power electronics or electronic components for radio frequency transmission, reception or amplification, current rectifier diodes or sensors.

Definitions:

In reference to FIGS. 1A and 1B, the geometric curvature of a raw crystal 5, in particular convexity or concavity, of the N face is defined relative to the N face. The curvature of the N face is determined by measuring the geometric deflection (distance between the N face and a plane tangent to this face). Symmetrically, the geometric curvature of the E face can be determined, especially convexity or concavity, by measuring the geometric deflection of the opposite E face. The deflections given in the examples were determined according to this convention. The deflection is negative in reference to a convex face and positive in reference to a concave face In reference to FIGS. 2A, 2B, 2C and 2D, a crystalline curvature of a crystalline plane 11 and a geometric curvature is illustrated for a raw crystal 5. Thus, FIG. 2A represents an ideal raw crystal 5, geometrically flat and with no crystalline curvature. In this crystal, the crystalline deflection representing the geometric curvature or deflection of a reference crystalline plane is zero. The crystalline deflection is negative in reference to a convex crystalline curvature and positive in reference to a concave crystalline curvature.

FIG. 2B illustrates a raw crystal 5, geometrically flat and with a crystalline curvature. In this crystal, the crystalline deflection representing the geometric curvature or deflection of a crystalline plane is not zero.

FIG. 2C illustrates a raw crystal 5 that has a concave geometric curvature and a concave crystalline curvature (positive crystalline deflection).

FIG. 2D also illustrates a raw crystal 5 that has a convex geometric curvature and a concave crystalline curvature (positive crystalline deflection).

Thus, as illustrated in these figures, the crystalline curvature can be different from the geometrical curvature of the crystal.

The geometric deflection or curvature of the wafer can be measured by means of a micrometre comparator of the profilometer type as described by EP1528591 A2 [0089].

The crystalline deflection or curvature of the wafer is measured by x-ray diffraction as described in the publication "Curvature and bow of bulk GaN substrates" by Humberto M. Foronda et al. and published in the Journal of Applied Physics 120, 035104 (2016). The radius of crystalline curvature $R_c$ is then defined by the following relation: $R_c = D^2/(8f_c)$ where $f_c$ designates the crystalline deflection D and the diameter of the wafer expressed in metres.

In the context of the present invention, the off-cut angle at a point on the surface of a wafer is also defined by the angle between:
the normal to a front face of the group 13 element nitride wafer (normal to the point for which the off-cut angle is defined) and
the normal (also known as the C-axis) to a crystal plane of orientation C (0001) (normal to the crystalline plane at the above-mentioned point).

The off-cut angle can be measured by X-ray diffraction according to the SEMI-MF26 standard entitled "Test Method for Determining the Orientation of a Semiconductive Single Crystal". The off-cut angle variation is defined as the difference between the highest off-cut angle and the lowest off-cut angle measured over at least 80%, preferably over at least 90%, preferably over at least 95% of the surface considered or of the maximum length of the wafer.

In the context of the present invention, the crystalline quality is also defined by the width at mid-height of the X-ray diffraction peak (XRD) of line (002) around angle ω in symmetrical condition of planes (0001) of the crystal (see, for example, the publication "AMC 2017—Advanced Materials Characterization Workshop June 6 & 7, X-ray analysis methods" by Mauro Sardela).

Grinding means any cutting or machining operation consisting of removing more than 5%, or even more than 10% by mass of material from the crystal wafer. In contrast, the so-called strain hardening operation, even when it is a grinding with fine abrasive, typically of grade 200 mesh or more according to the FEPA standard, leads to a very low loss of material, typically less than 5% or even less than 2%, or even less than 1% by mass loss of material.

Cleaning the wafer means any operation making it possible to eliminate organic and/or metallic contamination on the EN surfaces at ppb (parts per billion). It can consist of a chemical bath well known in the semiconductor trade and chosen from among SC1, SC2, piranha baths or carrot bath.

BRIEF DESCRIPTION OF THE DRAWINGS

Other advantages and characteristics of the method according to the invention and the associated product will appear more clearly from the following description of several variants of embodiment, given by way of non-limiting examples, from the attached drawings in which:

FIG. 5 describes the raw crystal according to a first example of embodiment.

FIG. 6 describes the raw crystal according to a second example of embodiment.

DETAILED DESCRIPTION OF THE INVENTION

Figure 3:
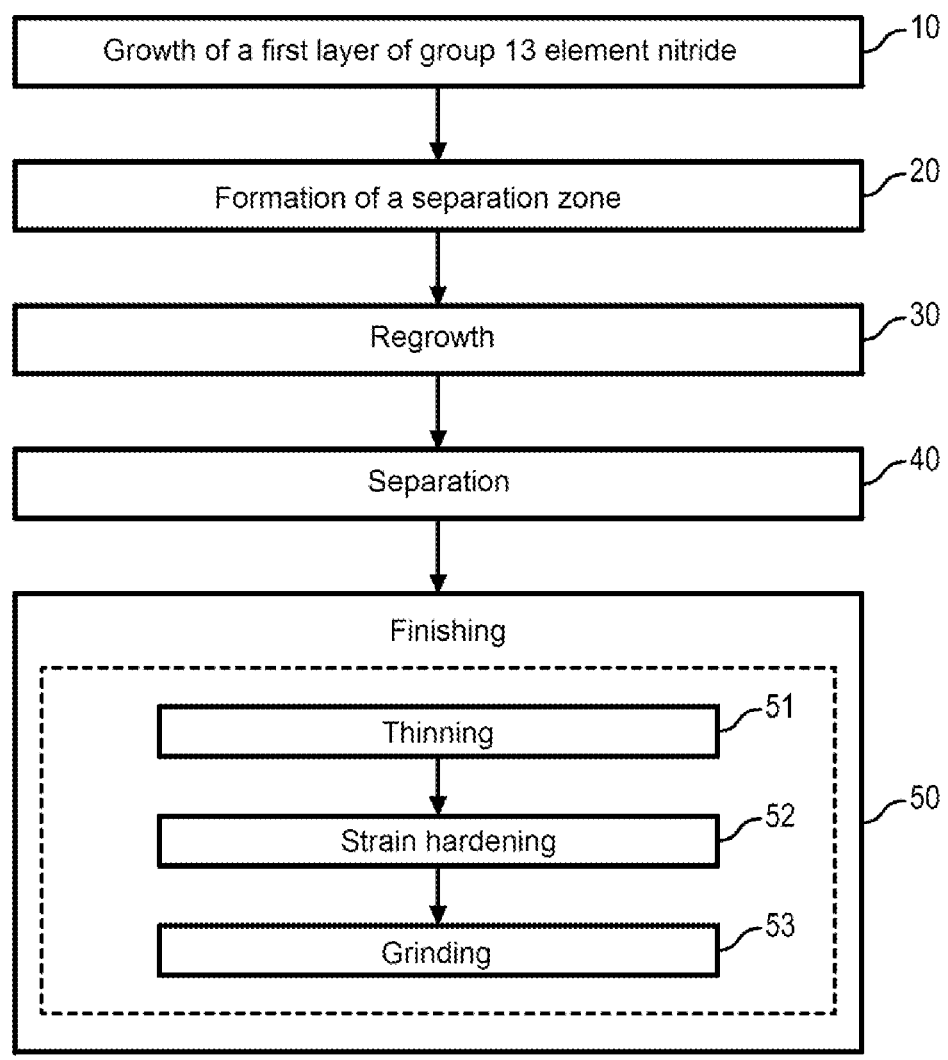
FIG. 3 illustrates a manufacturing method for a raw crystal according to the invention.

In reference to FIGS. 2 and 3, the major phases of the manufacturing method for GaN wafers is illustrated.

In the following, the method according to the invention will be described in reference to the manufacture of gallium nitride (GaN) wafers. However, it is quite obvious to the skilled person that the method described below can be used to grow a material including a layer of group 13 element nitride other than gallium nitride (GaN).

Preferred but non-limiting aspects of the product and method described above are described in the following parts:
The crystal is a gallium nitride crystal.
The crystal has a radius of curvature greater than 15 metres, preferably greater than 18 meters, more preferably greater than 20 meters, or even greater than or equal to 25 meters.
The crystal has a dislocation density of $10^{-7}$ cm$^{-2}$ or less.
Advantageously, the off-cut angle is non-zero in the vicinity of the center of the E face, for example of the gallium face, is comprised between 0.1 and 5 degrees, preferably between 0.2 and 0.8 degrees, still more preferably between 0.3 and 0.6 degrees, the cutting planes extending perpendicularly to the main axis A of the crystal, in particular along the plane a and m.

1. Manufacturing Method

The method according to the invention more particularly comprises the following successive steps:
a growth phase (10) of a first layer of group 13 element nitride (5a) on a starting substrate (1) having a crystallization plane whose off-cut angle is comprised between 0.1 and 5 degrees.
a formation phase (20) of a separation zone (4);
a regrowth phase (30) to form a second layer of group 13 element nitride (5b),
a separation phase (40) to obtain a self-supported crystal (5)
a finishing phase (50) of the raw crystal obtained characterized in that it comprises:
at least one strain hardening step (52) by damaging the surface corresponding to a concave crystalline curvature of said crystal, in order to straighten the crystalline planes, and
at least one grinding step (53) making it possible to geometrically straighten the crystal, in order to obtain a wafer according to the invention.
optionally, a prior thinning step (51) by removing material from the raw crystal according to the initial deflection of said crystal, in order to obtain a final wafer whose maximum deflection is less than 6×10$^4$ mm/mm of the longest length of said wafer.

1.1. Growth Phase 10

Optional growth phase 10 consists of forming an underlayer of GaN 5a by lateral overgrowth.

Lateral overgrowth makes it possible to minimize the density of defects contained in the GaN 5a underlayer.

The approach used to reduce the density of dislocations in the GaN 5a underlayer consists of:
initiating a GaN island growth mode, then to
promote the coalescence of the islands to obtain the GaN 5a underlayer.

Advantageously, lateral overgrowth is implemented in a starting substrate 1 having a non-zero off-cut angle.

The fact of using a starting substrate 1 having a non-zero off-cut angle makes it possible to grow a first layer of GaN 5a having a non-zero off-cut angle.

The starting substrate 1 is chosen from among Si, AlN, GaN, GaAs, Al$_2$O$_3$ (sapphire), ZnO, SiC, LiAlO$_2$, LiGaO$_2$, MgAl$_2$O$_4$, 4H—SiC, or any other type of starting substrate known to the skilled person to implement growth of gallium nitride.

Starting substrate 1 can have a thickness of several hundred micrometres, generally 350 micrometres.

Advantageously, the starting substrate 1 can be treated by nitriding prior to any deposition step. This makes it possible to improve the crystal quality of the GaN obtained.

The off-cut angle can be comprised between 0.1 and 5 degrees, preferentially between 0.2 and 0.8 degrees, and even more preferentially between 0.3 and 0.6 degrees (especially to limit stacking faults).

The growth of the GaN 5a underlayer can be implemented according to different variants. Especially, lateral overgrowth can be based:
on the use of a dielectric mask 3 including openings 3a in which islands form, such as described in document WO99/20816;
on the use of a dielectric layer with no openings in which islands form spontaneously, such as described in document EP 1338683.

1.1.1. First Variant of Lateral Overgrowth

In a first variant, the growth phase 10 consists of an epitaxial lateral overgrowth (ELO).

ELO includes a step of depositing a thicker flat layer 2 on the starting substrate 1.

This deposition is preferably done by metalorganic vapour phase epitaxy (MOVPE), for example at a temperature comprised between 500° C. and 700° C., especially 600° C.

The deposition of a layer 2 allows reducing the stresses between the starting substrate 1 and GaN underlayer 5a subsequently deposited by epitaxy there upon. Indeed, the deposition of layer 2 on substrate 1 ensures a "gentle" transition between substrate 1 and the GaN underlayer 5a whose crystalline structures are different.

The deposition of layer 2 also facilitates the subsequent separation of the GaN crystal 5, as will be seen from the description that follows. The layer 2 is, for example, a GaN layer, a AlN layer, or a AlGaN layer.

In another step, a mask 3 including openings 3a is formed. The openings 3a can be point-like or in the form of bands, and make it possible to define positions for the subsequent selective growth of GaN islands.

The mask 3 can be a mask of dielectric material, such as, for example, SiN$_x$ (SiN, Si$_3$N$_4$, etc.) or SiO$_2$ or TiN. This makes it possible to minimize the defects created at the edge of the mask and thereby improves the quality of the GaN layer deposited by epitaxy subsequently thereon.

Mask 3 can be formed by any technique known to the skilled person. For example, the formation of the mask can consist of:
depositing a dielectric layer 3b from gaseous silane and ammonia precursors directly on layer 2, and engraving by photolithography of the dielectric layer 3b to form openings 3a.

Thus a starting substrate 1 coated with a layer 2 and a mask 3 is obtained. In addition to its function of improving the quality of the GaN underlayer 5a (by filtering through defects), the mask 3 makes it possible to weaken the interface between the starting substrate 1 and the first layer of GaN 5a.

Another step consists of forming GaN islands through the openings 3a of mask 3. The growth rate along an axis orthogonal to the primary plane of starting substrate 1 is kept higher than the lateral growth rate. In this way, islands or bands of triangular section are obtained (depending on the shape of openings 3a). Inside these triangular-section bands, through dislocations are bent at 90°.

Then lateral overgrowth is performed to ultimately arrive at a flat ELO layer. At the end of this step of the process, a first GaN layer 5a is obtained having a dislocation density less than $10^8$ cm$^{-2}$.

1.1.2. Second Variant of Lateral Overgrowth

In a second variant, the growth phase 10 consists of an universal lateral overgrowth (ULO) such as described in document EP 1977028

ULO includes a step of depositing a nucleation layer 2 on the starting substrate 1.

The nucleation layer is, for example, a very thin film of silicon nitride SiN, of around a few atomic planes, in other words, of around 10 nm to 20 nm in thickness. The deposition of silane and ammonia based SiN can last 360 seconds.

A continuous buffer layer 2—for example GaN—is then deposited on the nucleation layer. The deposition of GaN buffer layer 2 makes it possible to filter the crystalline defects and thereby minimize from the start of the method the density of the defects that will be present in the GaN underlayer 5a subsequently deposited by epitaxy. The thickness of this GaN buffer layer 2 can be comprised between 10 and 100 nm. The temperature during this operation can be between 500 and 700° C.

Annealing is then carried out at a high temperature between 900 and 1150° C. Under the joint effect of the increase in temperature, the presence in the gaseous vehicle of a sufficient quantity of hydrogen and the presence of the very thin film of SiN, the morphology of the GaN buffer layer 2 undergoes a profound modification resulting from solid-phase recrystallization by mass transport. The initially continuous GaN buffer layer 2 is then converted into a discontinuous layer of GaN patterns. GaN patterns or islands of very good crystalline quality and retaining an epitaxial relationship with the starting substrate are thus obtained, thanks to the very small thickness of the nucleation layer.

The areas where silicon nitride SiN is stripped then function as a mask and the GaN patterns function as localized areas of GaN in the openings made ex situ in the mask. Then lateral overgrowth is performed to ultimately arrive at a flat ULO layer.

This method, where the silicon nitride mask is formed spontaneously and which involves the same mechanisms of curvature of the dislocations as in the ELO is identified as "ULO" (or "spontaneous ELO").

1.2. Phase (20) of Formation of a Separation Zone 4

The method also comprises a phase 20 of formation of a separation zone 4.

This phase 20 of formation of a separation zone can be implemented according to different variants. In particular, the phase 20 of formation of the separation zone can be implemented:

prior to the phase 10 of growth of the GaN underlayer (first variant), or after the phase 10 of growth of the GaN underlayer (second variant), or during the phase 10 of growth of the GaN underlayer (third variant).

1.2.1. First Variant of Formation of the Separation Zone 4

In a first variant, the phase 20 of formation of a separation zone 4 can consist of depositing a sacrificial intermediate layer prior to phase 10 of growth of the GaN underlayer 5a, such as described in document EP 1699951.

The intermediate layer, which can be $SiO_2$; SiN; Si; SiON; AlON; Al; ZnO; Ti; $TiO_2$; TiN; TiC; Ni; InN; $MoSi_2$ or ZrN, serves as the sacrificial layer designed to be spontaneously vapourised during the subsequent growth by epitaxy of the GaN underlayer 5a.

1.2.2. Second Variant of Formation of the Separation Zone

In a second variant, the phase 20 of formation of a separation zone 4 comprises an implantation step conducted after phase 10 of growth of the GaN underlayer 5a. This implantation makes it possible to create weakened zone in the GaN underlayer 5a.

The implantation consists of bombarding the GaN underlayer 5a with ions so as to create in the semiconductor at a depth close to the average depth of penetration of these ions, a layer of microcavities (or bubbles).

The implanted ions can be chosen from among tungsten, helium, neon, krypton, chromium, molybdenum, iron, hydrogen or boron. Preferably, the implanted ions are tungsten ions. These ions have the particular feature of breaking down GaN.

In terms of dose, when the ions implanted are H+, the dose of ions implanted can be comprised between $10^{16}$ and $10^{17}$ cm$^{-2}$ and the depth of implantation can vary from 0 nm to 50 nm starting from the free surface—called growth face—of the GaN underlayer 5a.

The implantation of embrittlement ions can be implanted in a single step or successive steps. The temperature can be comprised between 4K and 1400K during the implantation step. The implantation can be followed by an annealing phase to treat the crystalline damage created during the ion implantation; this annealing can be carried out at a temperature comprised between 500° C. and 1500° C.

1.2.3. Third Variant of Formation of the Separation Zone

In a third variant, the separation zone 4 can be formed during phase 10 of growth of the GaN underlayer 5a.

Especially when the growth phase is performed according to the first variant of embodiment, called ELO (i.e. deposition of the dielectric mask 3), the phase 20 of formation of the separation zone 4 can comprise the implantation of the buffer layer 2 prior to the deposition of mask 3.

This makes it possible to place the separation zone 4 at a precisely desired depth due to the fact that the first GaN layer 5a deposited during the ELO overgrowth step does not impede the implantation of ions.

Of course, the implantation can be done at different stages of the ELO (or ULO) lateral overgrowth phase, either in islands or at an intermediate stage where the islands have not entirely coalesced or after total coalescence of the islands.

1.3. Epitaxial Regrowth Phase 30

At the end of the phases 20 of forming a separation zone 4 and growth 10 of the GaN underlayer 5a, the method comprises an epitaxial regrowth phase 30 for forming a first thick layer of non-doped GaN 5b, a second thick layer of doped GaN 5c and a third thick layer of non-doped GaN 5d.

The method could also be directly started at this phase 30 by the formation of a thick layer of GaN 5b, the growth phases 10 and the formation of the separation zone phase 20 being optional. In the following text, phases 10 and 20 are considered to be applied.

This epitaxial regrowth can be implemented by:
Metalorganic vapour phase epitaxy (MOVPE),
hydride vapour phase epitaxy (HVPE);
Close-spaced vapor transport (CSVT); or even by
Liquid phase epitaxy (LPE).
Oxide vapour phase epitaxy (OVPE).

Preferably, this step implements the HVPE technology, which makes it possible to obtain three main interesting effects:
A first effect is that the GaN underlayer 5a is thickened without loss of its crystalline qualities (neither new dislocations nor cracks are generated),
A second effects is that the dislocation density is further reduced during repeat epitaxy by HVPE, by a factor at least equal to 2, beyond 100 µm of GaN growth (0001) (ref https://doi.org/10.1143/APEX.5.095503)
A third effect is that the thick GaN layer 5 thus obtained can, in certain cases, allow the spontaneous separation of its starting substrate 1 at the separation zone 4 in case of sublimation or mechanical fracture of said zone during HVPE growth.

More precisely, the regrowth is performed according to the following method: the temperature is increased under a mixed atmosphere of nitrogen, ammonia and hydrogen. As soon as a stable temperature of approximately 1000° C. is reached, the growth phase of a thick layer of GaN is then initiated by introducing gallium chloride (GaCl), for example, into the vapour phase. The GaCl and ammonia are partially pyrolyzed in the growth chamber, whose temperature is maintained at approximately 1000° C. Thus a monocrystalline deposit of GaN is progressively formed at the nucleation substrate (formed during the first growth phase).

It is necessary to obtain a sufficiently thick layer of GaN, therefore sufficiently strong from the mechanical viewpoint to prevent the fracture of the GaN layer into pieces of small area during the separation as well as to make it easier to handle it without breaking. Growth continues for several hours under these experimental conditions in order to reach a thickness of at least 200 microns of the GaN layer and preferentially a thickness greater than 1 mm.

Growth is then definitively completed by diverting the flow of HCl to the outside and cooling takes place in an atmosphere made up of nitrogen and ammonia.

The growth conditions for these first, second and third monocrystalline layers 5b, 5c, 5d are typically at a growth temperature comprised between 900 to 1200° C., with a growth rate that can be comprised between 50 and 500 micrometres/h, preferably between 70 and 200 micrometres/h.

The raw self-supported GaN crystal thus obtained has a thickness greater than 200 µm and preferentially greater than 1 mm. Its maximum thickness is less than 10 mm or even less than 5 mm.

The raw self-supported GaN crystal thus obtained has a diameter greater than 50 mm and preferentially a diameter greater than 100 mm. Its maximum diameter is less than 250 mm or even less than 200 mm.

Figure 4:
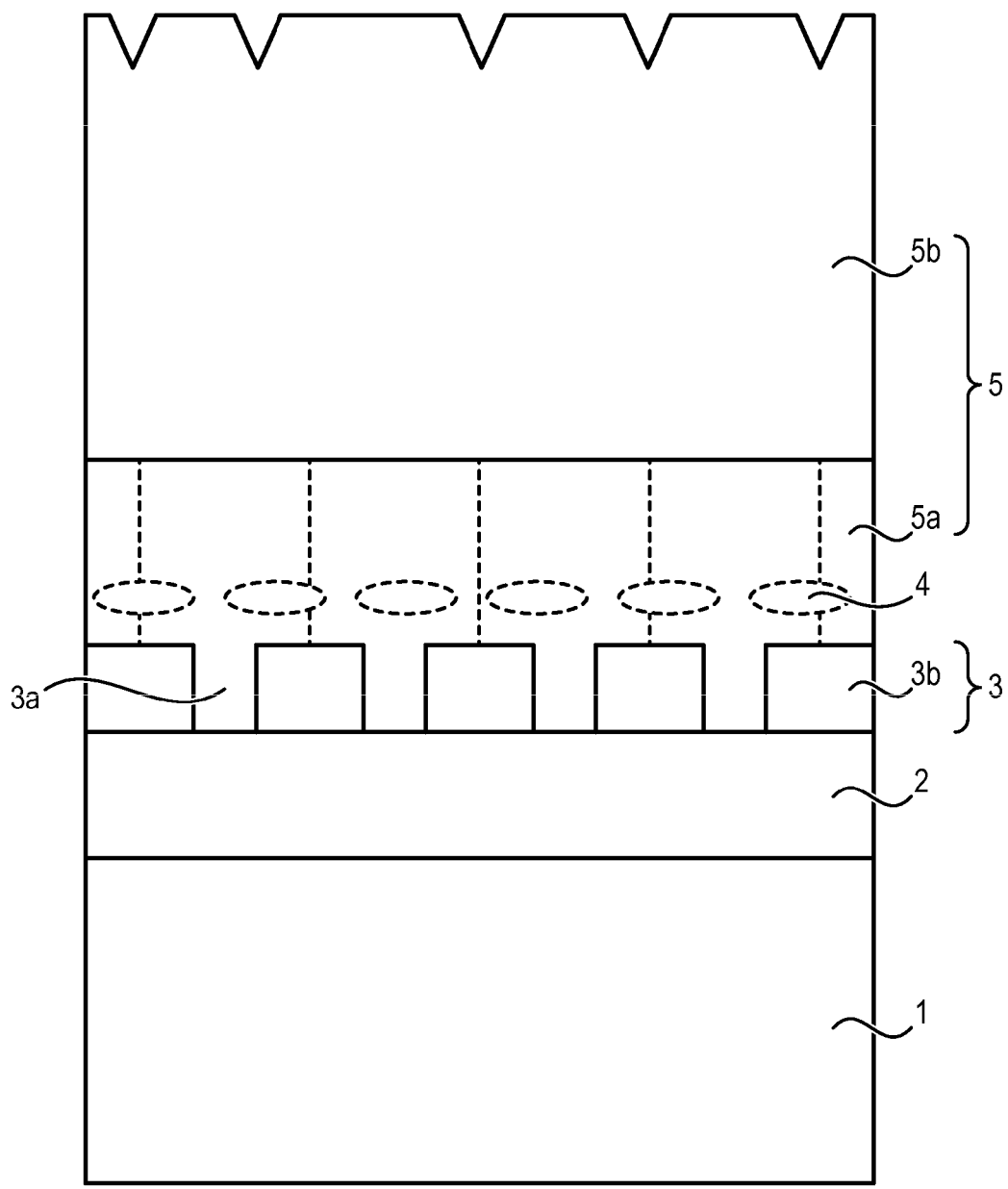
FIG. 4 illustrates the obtaining of a raw crystal according to the invention.

In reference to FIG. 4, the layer 5b has areas of permanent defects corresponding to recesses or wells of decreasing section in the direction opposite the direction of growth.

In a second step, under the same growth conditions, doping is performed by introducing the doping element n, to obtain a second monocrystalline GaN layer 5c on the layer 5b, according to the following process:

The introduction and concentration of oxygen are controlled by the purity of precursor element III and by carrying out very thorough purges of the reactor before growth under vacuum at a residual pressure of less than 500 torr.

For germanium: from a solid source, $GeCl_4$, germane, tetramethylgermanium, isobutylgermane and derivatives thereof. These doping gases are then vapourised in the reaction chamber. Preferably, these doping gases can be mixed beforehand in vapour phase with the flow of GaCl to improve the homogeneous distribution of the doping flow in the growth chamber.

In the case of a gaseous precursor, the gas reservoir is kept at a pressure comprised between 1 and 3 bar and a carrier gas flow ($N_2$ and/or $H_2$) of a flow rate comprised between 0.25 sccm and 20 sccm is applied.

For silicon, from silane, dichlorosilane, silicon tetrachloride and derivatives are vapourised in the reaction chamber. In the case of dichlorosilane (1% diluted in 99% $N_2$ (or $H_2$) a flow comprised between 1 and 20 sccm is applied. Preferably, these doping gases can be mixed beforehand in vapour phase with the flow of GaCl to improve the homogeneous distribution of the doping flow in the growth chamber.

The silicon and germanium can be introduced together, which leads to a system with 3 dopants.

Typically, the thickness of this first monocrystalline GaN layer 5b is from 100 to 1000 micrometres.

The permanent defect zones 6 of layer 5b cause the defects to also propagate in the layer 5b. Thus, during the growth of the second doped layer 5c, depressions are obtained in the material of the layer 5c in the depression zones coinciding with the defect zones of layer 5b.

Other forms of material depression can appear linked to inclusions or nucleations that locally modify the growth rate without, however, emerging on the upper surface of the layer 5b or even 5c.

In a third step, the introduction of doping gas n is discontinued and the growth conditions are maintained, making it possible to obtain on the preceding doped layer 5c, typically of 100 to 2000 micrometres thick, a third monocrystalline GaN layer 5d, typically 200 to 5000 micrometres thick.

The thickness obtained for the monocrystalline layer and the growth method for GaN 5d allow the depression zones of layer 5c to be filled by deposition of this third layer.

1.4. Separation Phase 40

A separation phase 40 is also implemented. This phase is dependent on the variant implemented for phase 20 of formation of separation zone 4.

In the case of an ion implantation, the spontaneous separation phase 40 takes place due to the thermal cycle (epitaxial regrowth at high temperature and cooling) that the thick GaN layer 5 undergoes which, because of the difference of thermal expansion coefficients between the starting substrate 1 and the thick GaN layer 5, generates stresses causing its separation.

In the case where an intermediate sacrificial layer is deposited, this separation occurs during the epitaxial regrowth (repeat epitaxy) by spontaneous vaporisation of the intermediate layer or even by mechanical fracture at the said sacrificial layer. In the case of post-growth separation, a laser can be used to vaporise the sacrificial layer.

Figure 1A:
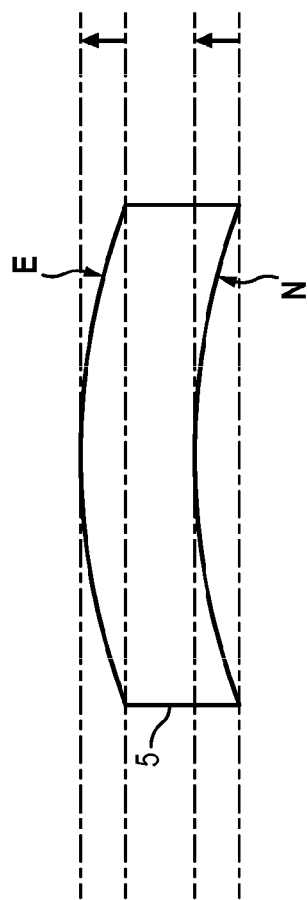
FIGS. 1A and 1B illustrate the determination of the geometric deflection of a raw crystal.
Figure 1B:
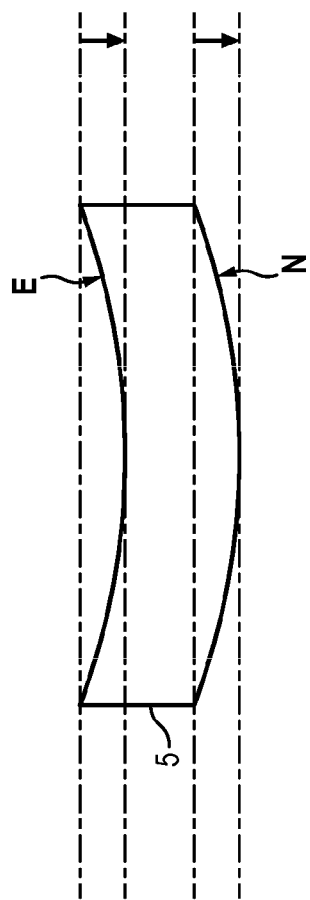
Figure 2C:
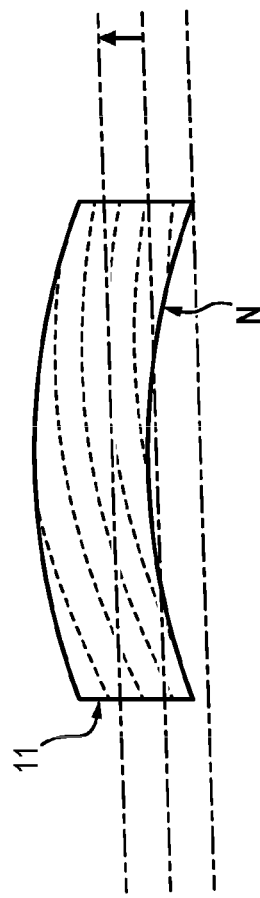
FIGS. 2A, 2B, 2C and 2D describe crystals having a crystalline curvature or deflection different from their geometric curvature or deflection.
Figure 2D:
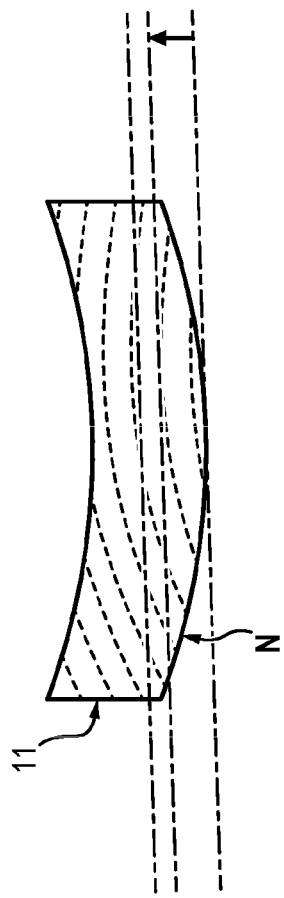
Figure 2A:
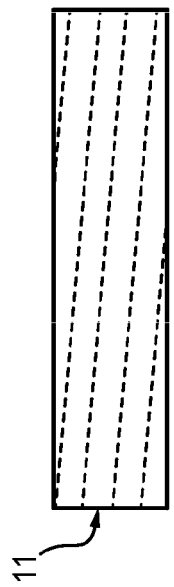
Figure 2B:
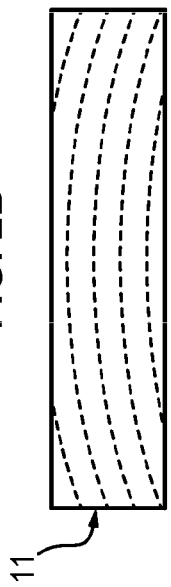

Thus a self-supported GaN crystal 5 is obtained as illustrated in FIG. 1A or 1B.

Such a crystal may be curved and has a radius of curvature typically greater than 5 metres and less than 25 metres and preferably less than 20 metres. Moreover, crystal 5a also has a dislocation density of $10^7$ $cm^{-2}$ or less, preferably $5\times10^6$ $cm^{-2}$.

Since the GaN 5 crystal was formed on a starting substrate having a non-zero off-cut angle (or miscut angle), it also has a non-zero off-cut angle, the orientation of crystalline planes being propagated from one layer to the other. For example, in the case of a sapphire substrate 1 of off-cut angle equal to 4 degrees, the growth face of crystal 5 has a off-cut angle equal to 4 degrees, preferably comprised between 0.1 and 1 degree over its entire surface.

1.5. Finishing Phase 50

Once the GaN crystal 5 is separated from the starting substrate 1, a finishing phase 50 of the obtained raw crystal is performed in order to obtain a final wafer with a maximum deflection less than $6\times10^{-4}$ mm/mm of crystal width. Finishing phase 50 comprises:

Optionally, a prior thinning step 51 by removing material from the raw crystal depending on the initial deflection of said crystal. Preferentially, thinning is done by machining to a relative thickness greater than $5\times10^{-3}$ and less than $10^{-2}$, said thickness corresponding to the ratio of the thickness of the wafer to the longest length of its faces.

At least one strain hardening step 52 by damaging the surface corresponding to a concave crystalline curvature of said crystal, in order to straighten the crystalline planes to reduce the variation of the off-cut angle. Strain hardening can be performed by surface abrasion, for example by sandblasting, shot blasting, grinding, lapping or exposure to laser radiation to generate a strain hardening layer. Strain hardening can also be carried out by another technique suitable for cutting group 13 element nitride monocrystals under mechanical stress. According to a particular embodiment, strain hardening is carried out until the variation of the off-cut angle is less than $5\times10^{-3}$°/mm of the largest dimension of said wafer.

Preferably, strain hardening is carried out on the face of the wafer on which the crystal deformation is concave or for which the curvature of the crystal lattice is concave.

Preferably, strain hardening is carried out on a wafer not attached to a support. Advantageously, strain hardening is done until a crystalline deflection is obtained comprised in absolute value between 0.2 and 2, preferably between 0.3 and 1.5, even between 0.4 and 1.0 μm/mm of the largest dimension of the wafer, in the case where the N face of the wafer is concave. In the case where the N face of the wafer is convex, the strain hardening is preferably carried out until a crystalline deflection is obtained comprised in absolute value between 0.1 and 1.5, preferably between 0.2 and 1.2, even between 0.2 and 1.0 μm/mm of the largest dimension of the wafer, At least one grinding step making it possible to geometrically straighten the crystal. Then N face and/or E face and the sides or edges of the wafer are ground with polishing, in order to obtain an acceptable surface state for the application of an optoelectronic or electronic component.

The finishing step can also comprise other steps, such as chemical etching of the N face after machining the N face or after polishing the E face, a cleaning to decontaminate the wafer surfaces and/or a preparation of the E face, in particular by plasma engraving, for subsequent deposition of at least one layer necessary to create an optoelectronic or electronic components.

Thus, the proposed method is particularly suited to the manufacture of slices or wafers of semiconductor material, in particular slices or wafers of element nitride of group 13 or III of the periodic table, more particularly slices or wafers composed of group 13 nitride, preferably of GaN, of large diameter, greater than 50 mm, than 100 mm or even 150 to 200 mm.

The final slice or wafer of semiconductor material according to the invention has a thickness of 200 to 2000 micrometres, preferentially of approximately 400 micrometres, and an excellent crystalline quality such that the width at mid-height of the x-ray diffraction peak (XRD) of line (002) around the angle ω in symmetrical condition of the GaN films (0001) is less than 130 ArcSec in the case of a gallium nitride wafer.

The crystal undergoes a trimming operation then is cut into several slices or wafers typically of 100 to 600 micrometres thick using loose wire saw (abrasive particles in a slip which impregnates the wire before cutting), or fixed wire saw (abrasive particles previously fixed onto the wire).

The crystal is cut along transverse cutting planes P orthogonal to the main axis A of the crystal. This makes it possible to obtain a much better material yield than that described in document US 2012/0184090. Current techniques make it possible to control the elimination of a layer thickness to within 10 micrometres.

The present invention and its advantages are illustrated by means of the following examples. Of course, the examples according to the invention should not be considered as limiting its implementation.

Examples of Embodiment

Raw GaN crystals of 100 mm diameter were obtained by growth via HVPE on the base of a substrate such as described, for example, by WO/03100839A2 according to step 3 incorporated by reference. The flow rate (volume) ratio of $N_2(N_2+H_2)$ is 0.2. The crystals typically have a thickness between 500 and 2000 micrometres.

In the following examples, crystals according to FIG. 5 have a concave N face and curved crystalline planes following the geometric curvature of the crystal were obtained. A first series was treated according to the finishing method of the invention and the other series according to a known method for comparison purposes.

The final crystals of the examples below have a ratio (FWHMN FWHMGa)/thickness of the wafer, where FWHMN designates the width at mid-height of the X-ray diffraction peak (XRD) of the line (201) around the angle ω in asymmetric condition of the GaN planes (0001) on the nitrogen face and FWHME the one on the group 13 face, which is −0.4 ArcSec/micron of wafer thickness.

The geometric deflection or curvature of the wafer for a diameter of 100 mm was measured on the N face using a micrometre comparator of the profilometer type as described by EP1528591 A2 [0089] and the crystalline deflection for a diameter of 100 mm of the wafer was measured by x-ray diffraction as described in the publication "Curvature and bow of bulk GaN substrates" by Humberto M. Foronda et al. published in the Journal of Applied Physics 120, 035104 (2016).

The off-cut angle, expressed in degrees per 100 mm of width of the wafer, was measured on the wafer over the entire width of the wafer except the ends, i.e. over at least approximately 95 mm of the width of the wafer, by X-ray diffraction according to the standard SEMI-MF26. At each point of the wafer, the off-cut angle corresponds to the difference between the plane m of the crystal and the plane normal to the surface at this point. The variation of the off-cut angle is defined as being the deviation between the highest angle and the lowest angle, for 100 mm diameter of the wafer. Steps f), h) and i) have not been detailed in the examples below because the angle variation deviations are small but an overall angle variation has been specified for all of these steps.

The results are shown in Table 1 below:

TABLE 1

| Steps of the finishing process Resulting deflection at each successive treatment step (the geometric and crystalline deflections are measured in reference to the N face) | Invention Example 1 | Comparative Example 1a | Comparative Example 1b |
|---|---|---|---|
| Initial step- raw crystal Geometric deflection (μm) | +115 | +121 | +115 |
| Crystalline deflection (μm) | +115 | +121 | +115 |
| Variation of the off-cut angle | 0.20 | 0.20 | 0.20 |
| b)-Thickness adjustment | (machining of the Ga face) | Na (not applied) | (machining of the Ga face) |
| Geometric deflection (μm) | +155 | | +155 |
| Crystalline deflection (μm) | +155 | | +155 |
| Variation of the off-cut angle | 0.71 | | 0.71 |
| c)-Strain hardening the N face | (Sandblasting the N face) | Na | Sandblasting the N face until a zero geometric deflection is obtained |
| Geometric deflection (μm) | −50 | | |
| Crystalline deflection (μm) | −50 | | |
| Variation of the off-cut angle | 0.23 | | |
| d)-grinding the N face Geometric deflection (μm) | −40 | +55 | +48 |
| Crystalline deflection (μm) | −40 | +140 | +135 |
| Variation of the off-cut angle | 0.18 | 0.64 | +62 |
| g) chemical etching the N face Geometric deflection (μm) | −20 | −21 | 13 |
| Crystalline deflection (μm) | −20 | +110 | +105 |
| Variation of the off-cut angle | 0.10 | 0.50 | 0.48 |
| d) -grinding Ga face Geometric deflection (μm) | +70 | +61 | +52 |
| Crystalline deflection (μm) | +70 | +150 | +140 |
| Variation of the off-cut angle | 0.32 | 0.69 | 0.64 |
| f) h) i) Finished product after cleaning and plasma engraving Geometric deflection (μm) | +40 | +41 | +27 |
| Crystalline deflection (μm) | +40 | +115 | +107 |
| Crystalline quality gradient (arcsec/micron) | −0.8 | −0.8 | −0.8 |
| Variation of the off-cut angle | 0.15 | 0.51 | 0.49 |

Na = not applied

As can be seen in this Table 1, the proposed method, in comparison to a method without a strain-hardening step (1a) makes it possible to obtain a substantial reduction of the crystalline deflection and the off-cut angle variation. In particular the prior strain-hardening step makes it possible to straighten or even reverse the crystalline curvature in order to anticipate the deformations generated by the subsequent finishing operations, in particular the operation of grinding the wafer. This prior strain-hardening step thus makes it possible to obtain a wafer whose crystalline and geometric deflection or deformation are both very low.

In the following examples, crystals according to FIG. 6 have a convex N face and curved crystalline planes following the geometric curvature of the crystal were obtained. A first series was treated according to the finishing method according to the invention and the other series according to a known method for comparison purposes.

Also in comparison with a process where, in step c), the wafer is straightened in a sandblasting step until a zero geometric deflection (1b) is obtained, a significant crystalline deflection is obtained for the finished product. The results are shown in Table 2 below:

TABLE 2

| Steps of the finishing method resulting deflection at each successive treatment step (the geometric and crystalline deflections are measured in reference to the N face) | Invention Example 2 | Comparative Example 2 |
|---|---|---|
| Initial step - raw crystal Geometric deflection (μm) | −141 | −132 |
| Crystalline deflection (μm) | −141 | −132 |
| Variation of the off-cut angle | 0.6 | 0.5 |
| b) thickness adjustment | (machining of the Ga face) | |
| Geometric deflection (μm) | −60 | |
| Crystalline deflection (μm) | −60 | Na |
| Variation of the off-cut angle | 0.28 | |

TABLE 2-continued

| Steps of the finishing method resulting deflection at each successive treatment step (the geometric and crystalline deflections are measured in reference to the N face) | Invention Example 2 | Comparative Example 2 |
|---|---|---|
| c) Strain hardening face Ga | (Sandblasting face Ga) | |
| Geometric deflection (μm) | −30 | Na |
| Crystalline deflection (μm) | −30 | |
| Variation of the off-cut angle | 0.14 | |
| d) grinding the N face | | |
| Geometric deflection (μm) | −90 | −50 |
| Crystalline deflection (μm) | −91 | −178 |
| Variation of the off-cut angle | 0.41 | 0.82 |
| g) chemical etching the N face | −60 | −20 |
| Geometric deflection (μm) | | |
| Crystalline deflection (μm) | −61 | −145 |
| Variation of the off-cut angle | 0.28 | 0.66 |
| e) -grinding face Ga | +74 | +102 |
| Geometric deflection (μm) | | |
| Crystalline deflection (μm) | +12 | −60 |
| Variation of the off-cut angle | 0.06 | 0.28 |
| f) h) i) Finished product after cleaning and plasma engraving Geometric deflection (μm) | +23 | +50 |
| Crystalline deflection (μm) | −42 | −115 |
| Crystalline quality gradient (arcsec/micron) | −0.8 | −0.8 |
| Variation of the off-cut angle | 0.19 | 0.53 |

As can be seen in this Table 2, the proposed method, in comparison to a traditional method makes it possible to obtain a substantial reduction of the crystalline deflection and the off-cut angle variation.

The proposed method therefore makes it possible to obtain a group 13 element nitride crystal wafer having a high crystalline quality and a crystalline gradient greater than 5% whose variation of the off-cut angle and geometric deformation are permanently very low despite the multiple deformations generated by the finishing steps between obtaining the raw crystal and the final wafer ready to create an optoelectronic or electronic component.

In particular, it is possible to obtain a very low variation of the off-cut angle by combining strain hardening, not for purposes of geometrically straightening the crystal but rather for purposes of reducing its crystal off-cut angle variation. The geometric deformation of the crystal due to this strain hardening step c is then corrected by subsequent grinding steps which will allow a reduction in the geometric deformation of the crystal.

Advantageously, the off-cut angle at the centre of the wafer is around 0.5 degrees.

Advantageously, the curvature or geometric deformation of its faces has a deflection less than $10^{-3}$ mm/mm of the largest dimension of said wafer.

Also, advantageously, the quality gradient is comprised between −0.005 ArcSec/micron and −5 ArcSec/micron.

Also, advantageously, the crystal has a dislocation density of $10^7$ cm$^{-2}$ or less.

Also, advantageously, the proposed method makes it possible to obtain a wafer in which:
at least one face, preferably the E face, has a mean square surface roughness (defined according to the standard NF EN ISO 4287 December 1998) less than 0.5 nm over a surface area of 4 μm$^2$, and/or in which the crystal has a dislocation density of $10^7$ cm$^{-2}$ or less; and/or
the electrical resistivity measured is less than 25 mOhms·cm; and/or
the absorption coefficient measured at a wavelength of 400 nm is less than 4 cm$^{-1}$.

Also, the proposed method is particularly advantageous for obtaining a crystal wafer of group 13 element nitride, the curvature or geometric deformation of which and the off-cut angle variation are very low, having a ratio R of the longest length (in micrometres) to the thickness of the wafer (in micrometres) comprised between 80 and 500, preferably between 100 and 500, preferably between 100 and 450, or even between 100 and 350.

Table 3 below presents the ratio R obtained for wafers of different dimensions obtained according to the proposed method:

TABLE 3

| Wafer (inches) | Longest length (mm) | Thickness (μm) | Ratio R:length (μm)/thickness (μm) |
|---|---|---|---|
| 2" | 50.8 | 100-600 | 80-500 |
| 4" | 100 | 200-1000 | 100 to 500, preferably 100 to 450 |
| 6" | 150 | 300, preferably 400 to 1500 | 100 to 500, preferably 100 to 450, preferably 100 to 400 |
| 8" | 200 | 400, preferably 500, preferably 600 to 2000 | 100 to 500, preferably 100 to 450, preferably 100 to 400; preferably 100 to 350 |

The invention claimed is:

1. Two-dimensional crystal wafer of group 13 or III element nitride, delimited by a face of orientation N, an opposite face of orientation E according to the group 13 or III element, E being chosen preferably from Ga, In, Al or a combination of these elements:
wherein:
the variation of the crystalline off-cut angle along the largest dimension of said wafer is less than $5 \times 10^{-3}$°/ mm, and
its geometric curvature or deformation of its faces has a deflection less in absolute value than $10^{-3}$ mm/mm of the largest dimension of said wafer.

2. Wafer according to claim 1 whose crystalline curvature or crystalline deflection is less in absolute value than $10^{-3}$ mm/mm of the largest dimension of said wafer.

3. Wafer according to claim 1 whose E face is convex and the geometric deflection of said E face is negative and greater than $-10^{-3}$ mm/mm of the largest dimension of said wafer, preferably greater than $-0.7 \times 10^{-3}$ mm/mm of the largest dimension of said wafer.

4. Wafer according to claim 1 in which FWHME designates the width at mid-height of the x-ray diffraction peak of the line (002) around the angle ω measured on the E face and where FWHME is less than 130 ArcSec and the quality gradient defined by the ratio (FWHM'N-FWHM'E)/thickness of said wafer, where FWHM'N designates the width at mid-height of the X-ray diffraction peak of the line (201) around the angle ω measured on the N face (Nitrogen) and FWHM'E is that measured on E face, is comprised in absolute value between 0.005 and 5 ArcSec/micrometre.

5. Wafer according to claim 1, wherein at least one face, preferably the E face, has a surface with a crystalline quality and roughness allowing the growth of a subsequent layer along a single direction.

6. Wafer according to claim 1, whose crystalline off-cut angle along the largest dimension of said wafer is greater than $2 \times 10^{-3}$° mm.

7. Wafer according to claim 1, whose crystalline off-cut angle along the largest dimension of said wafer and measured at the centre of said wafer is greater than $3 \times 10^{-3}$° mm and/or less than $7 \times 10^{-3}$° mm.

8. Wafer according to claim 1, wherein the group 13 or III element is chosen from Ga, In or Al, preferably the group 13 or III element comprises gallium.

9. Wafer according to claim 1, wherein the group 13 or III element is gallium.

10. Wafer according to claim 1 whose diameter is greater than 50 mm.

11. Wafer according to claim 1, whose ratio R of the largest length to the thickness of the wafer is comprised between 80 and 500, preferably between 100 and 500, preferably 100 and 450, even between 100 and 350.

12. Method for manufacturing the wafer according to claim 1, comprising the following steps:
a: obtaining a self-supported raw crystal wafer of group 13 element nitride by epitaxial growth,
b: determining the variation of the off-cut angle of said raw crystal at the end of growth, optionally after cutting said crystal, preferably by grinding or by cutting with a wire saw, to a relative thickness greater than $5 \times 10^{-3}$ and less than $10^{-2}$, said relative thickness corresponding to the ratio of the thickness of the wafer to the largest width of its faces,
c: strain hardening of one face in order to reduce the variation of the off-cut angle, in particular by sandblasting, exposure to laser radiation, shot peening, ion bombardment or another technique making it possible to create a surface mechanical stress on said crystal, so as to obtain a non-zero geometric deflection, in particular a geometric deflection comprised in absolute value between 0.001 and 1, preferably between 0.01 and 0.1 mm/mm of the largest dimension of said wafer
d: after strain hardening, grinding the N face by machining,
e: after strain hardening, grinding the E face by machining,
f: polishing the E face,
g: chemical etching the N face after machining the N face or after polishing the E face,
h: cleaning to decontaminate the surfaces of the wafer
i: preparation of the E face, in particular by plasma engraving, for subsequent deposition of at least one layer necessary for the production of an optoelectronic or electronic component.

13. Manufacturing method according to claim 12, wherein the strain hardening step c) is carried out until the variation of the off-cut angle is less than $5 \times 10^{-3}$° mm of the largest dimension of said wafer.

14. Manufacturing method according to claim 12, wherein strain hardening step c is carried out on the crystal face for which the curvature of the crystal lattice is concave.

15. Manufacturing method according to claim 12, wherein step c of strain hardening is carried out until a crystalline deflection comprised between 0.2 and 2 μm/mm of the largest dimension of the wafer is obtained, in the case where the N face of the wafer is concave.

16. Manufacturing method according to claim 12, wherein step c of strain hardening is carried out until a crystalline deflection comprised between 0.1 and 1.5 μm/mm of the largest dimension of the wafer is obtained, in the case where the N face of the wafer is convex.

17. Manufacturing method according to claim 12, wherein the step of growing the wafer of group 13 or III element nitride comprises the following phases:
a growth phase of a first layer of group 13 element nitride on a starting substrate having a crystallization plane whose off-cut angle is comprised between 0.1 and 5 degrees, preferably comprised between 0.2 and 0.8 degrees, and even more preferably comprised between 0.3 and 0.6 degrees;
a formation phase of a separation zone;
a regrowth phase to form a second layer of group 13 element nitride,
a separation phase to obtain the crystal.

18. Use of a group 13 or III element nitride wafer according to claim 1 for the fabrication of optoelectronic or electronic components, such as light-emitting diodes, laser diodes, transistors with vertical or horizontal geometry, power electronics or electronic components for radio frequency transmission, reception or amplification, current rectifier diodes or sensors.

* * * * *